(12) United States Patent
Hasegawa et al.

(10) Patent No.: US 6,179,628 B1
(45) Date of Patent: Jan. 30, 2001

(54) ELECTRIC CONNECTION BOX

(75) Inventors: Shin Hasegawa; Mitsuo Tanaka; Tadashi Ikezawa, all of Shiga (JP)

(73) Assignee: Furukawa Electric Co., Ltd., Tokyo (JP)

( * ) Notice: Under 35 U.S.C. 154(b), the term of this patent shall be extended for 0 days.

(21) Appl. No.: 09/355,971
(22) PCT Filed: Nov. 24, 1998
(86) PCT No.: PCT/JP98/05271
§ 371 Date: Aug. 14, 1999
§ 102(e) Date: Aug. 14, 1999
(87) PCT Pub. No.: WO99/34494
PCT Pub. Date: Jul. 8, 1999

(30) Foreign Application Priority Data

Dec. 25, 1997 (JP) .................................... 9-358241

(51) Int. Cl.$^7$ .................................................. H01R 12/00
(52) U.S. Cl. ........................ 439/76.2; 439/949; 439/212
(58) Field of Search ................................. 439/76.2, 949, 439/212, 34

(56) References Cited

U.S. PATENT DOCUMENTS

| | | | |
|---|---|---|---|
| 4,723,196 | * 2/1988 | Hofmeister et al. | 439/76.1 |
| 4,775,333 | * 10/1988 | Grider et al. | 439/736 |
| 5,207,587 | * 5/1993 | Hamill et al. | 439/76.2 |
| 5,229,922 | * 7/1993 | Muramatsu et al. | 439/76.2 |

FOREIGN PATENT DOCUMENTS

| | | |
|---|---|---|
| 1-79325 | 5/1989 | (JP) . |
| 1-202109 | 8/1989 | (JP) . |
| 1-145166 | 10/1989 | (JP) . |
| 4-61417 | 5/1992 | (JP) . |
| 5-3619 | 1/1993 | (JP) . |
| 10-117420 | 5/1998 | (JP) . |

* cited by examiner

Primary Examiner—Paula Bradley
Assistant Examiner—Tho D. Ta
(74) Attorney, Agent, or Firm—Arent Fox Kintner Plotkin & Kahn, PLLC

(57) ABSTRACT

An electric connection box of the present invention comprises an upper case, a lower case fitting with the upper case, a connector housing connecting with a connector from the outside, one or a plurality of bus-bars each arranged sandwiched between the upper case and the lower case and having a terminal portion comprised of a plurality of terminal pieces positioned arranged in parallel inside the connector housing and a bus-bar body integrally formed with the terminal portion, and an insulator provided at least between the plurality of terminal pieces to connect and secure the terminal pieces to each other, by which insulator the narrow width terminal pieces are connected with each other and disturbance of the pitch or deformation is prevented.

3 Claims, 6 Drawing Sheets

ELECTRIC CONNECTION BOX

TECHNICAL FIELD

The present invention relates to an electric connection box used for vehicles and the like, more specifically relates to an electric connection box housing inside it a bus-bar having a plurality of terminals for external connections.

BACKGROUND ART

Recently, notable attempts have been made to incorporate electronics into automobiles and other vehicles, especially to incorporate electronics into the signal processing system of the control unit, the operating system, and other major areas. Accordingly, there is a tendency for an increase in the wiring work for the power supply etc. in vehicles. Especially, the bus-bars (basic wiring as power supply lines) for power supply have become thicker and have become harder to arrange. In addition, it is necessary to always meet the dimensional demands due to the limited space for installation in vehicles.

In view of this situation, the electrical connection box used in an automobile etc. generally comprises a pair of cases which fit with each other, a bus-bar as the basic wiring housed inside the pair of cases, and a connector housing attached so as to surround a plurality of terminal pieces formed projecting out from the bus-bar and connecting with connectors from the outside.

In this electrical connection box, the increase of the auxiliaries installed in automobiles has led to a need to increase the circuits corresponding to these auxiliaries, so a plurality of bus-bars serving as basic wiring used built inside it are now being provided or the width of the plurality of terminal pieces extending from the body of the bus-bar is being reduced so as to increase the density of the connectors to be connected with from the outside.

When reducing the width of the plurality of terminal pieces, however, the strength of the terminal pieces declines, so the terminal pieces deform when pushed in the insertion direction at the time of connecting with connectors or the arrangement of the plurality of terminal pieces is easily disturbed. Accordingly, in an electrical connecting box using a bus-bar having narrow width terminal pieces, the plurality of terminal pieces are prevented from deforming or the arrangement is prevented from being disturbed by separately providing supporting members to support each of the plurality of terminal pieces.

Accordingly, in an electrical connection box using a bus-bar having narrow width terminal pieces, there has been the problem that when the shape of the bus-bar differs due to the grade or destination, even with the same electrical connection box, it is necessary to provide supporting members matching with it and therefore the structure of the case or the connector housing becomes complex resulting in the increase of the manufacturing costs or the number of parts increases resulting in a higher cost for parts control.

Furthermore, a bus-bar is generally formed by punching it out from a metal sheet by a press in the shape of the body of the bus-bar and the plurality of terminal pieces. The terminal portion is then formed by bending the plurality of terminal pieces into predetermined shapes. However, with narrow width terminal pieces, there have been the problems of the pitch between the parallel provided terminals being disturbed or the terminal pieces deforming during this bending operation.

DISCLOSURE OF THE INVENTION

A first object of the present invention is to provide an electrical connection box capable of supporting terminal pieces without making the structure of the case etc. complex and increasing the number of components even when using a bus-bar having narrow width terminal pieces.

A second object of the present invention is to provide an electrical connection box capable of making the density of connectors connected with from the outside higher by using a bus-bar having narrow width terminal pieces.

To attain the above objects, according to a first aspect of the present invention, there is provided an electric connection box comprising a first case; a second case fitting with the first case; a connector housing for connecting with a connector from the outside; a bus-bar arranged to be sandwiched between the first case and the second case and having a terminal portion comprised of a plurality of terminal pieces positioned arranged in parallel inside the connector housing and a bus-bar body integrally formed with the terminal portion; and an insulator provided at least between the plurality of terminal pieces to connect and secure the terminal pieces to each other.

By doing so, since the plurality of terminal pieces are firmly secured to each other by the insulator, disturbance of the pitch between the terminal pieces or deformation can be prevented.

In the above configuration, the plurality of terminal pieces forming the terminal portion may be bent to identical crank shapes.

By doing so, it is possible to have the portions bent in the crank shape absorb any impact etc. when connecting the connectors and thereby possible to prevent the deformation or damage of the terminal pieces.

Also, in the above configuration, the plurality of terminal pieces forming the terminal portion may be bent in identical crank shapes and the insulator may be arranged in parallel to bent portions formed by bending in the crank shapes.

By doing so, since it is possible to have the portions bent in a crank shape absorb any impact etc. when connecting with a connector so as to prevent deformation or a damage of the terminal pieces and since the plurality of terminal pieces are firmly secured to each other by the insulator, disturbance of the pitch between the terminal pieces or deformation can be prevented.

According to a second aspect of the present invention, there is provided an electric connection box comprising a first case; a second case fitting with the first case; a connector housing for connecting with a connector from the outside; a plurality of bus-bars arranged sandwiched between the first case and the second case, having terminal portions comprised of a plurality of terminal pieces positioned arranged in parallel inside the connector housing and flat sheet-like bus-bar bodies integrally formed with the terminal portions, and stacked with each other; a plurality of insulators provided so as to connect and secure the plurality of terminal pieces forming the terminal portions of the plurality of bus-bars to each other; and a plurality of insulating sheets arranged in a state sandwiched between the plurality of stacked bus-bars.

By doing so, since the plurality of terminal pieces forming one terminal portion are firmly secured to each other by an insulator, disturbance of the pitch between the terminal pieces or deformation can be prevented. Further, by stacking a plurality of bus-bars having such terminal portions, the density of connectors connected with from the outside can be made higher.

In the above configuration, the plurality of terminal pieces forming the terminal portions may be bent in identical crank shapes and the plurality of bus-bars may be stacked so that the insulators provided at the terminal portions are superposed over each other.

By doing so, the portions bent in a crank shape can be made to absorb any impact etc. when connecting with an connector and thereby prevent deformation or damage of the terminal pieces and the portions bent in a crank shape can be used to position the stacked bus-bars.

Also, in the above configuration, the plurality of terminal pieces forming the terminal portions may be bent in identical crank shapes, the insulators may be arranged in parallel to the bent portions formed by bending in the crank shapes, and the plurality of bus-bars may be stacked so that the insulators provided at the terminal portions are superposed over each other.

By doing so, the portions bent in a crank shape can be made to absorb any impact etc. when connecting with the connectors and thereby prevent deformation or damage of the terminal pieces, disturbance of the pitch between the terminal pieces or deformation can be prevented since the plurality of terminal pieces are firmly secured to each other by insulators, and the portions bent in a crank shape can be used to position the stacked bus-bars.

BEST MODE FOR CARRYING OUT THE INVENTION

Below, embodiments of the present invention will be explained in detail based on FIG. 1 to FIG. 6.

Figure 1:
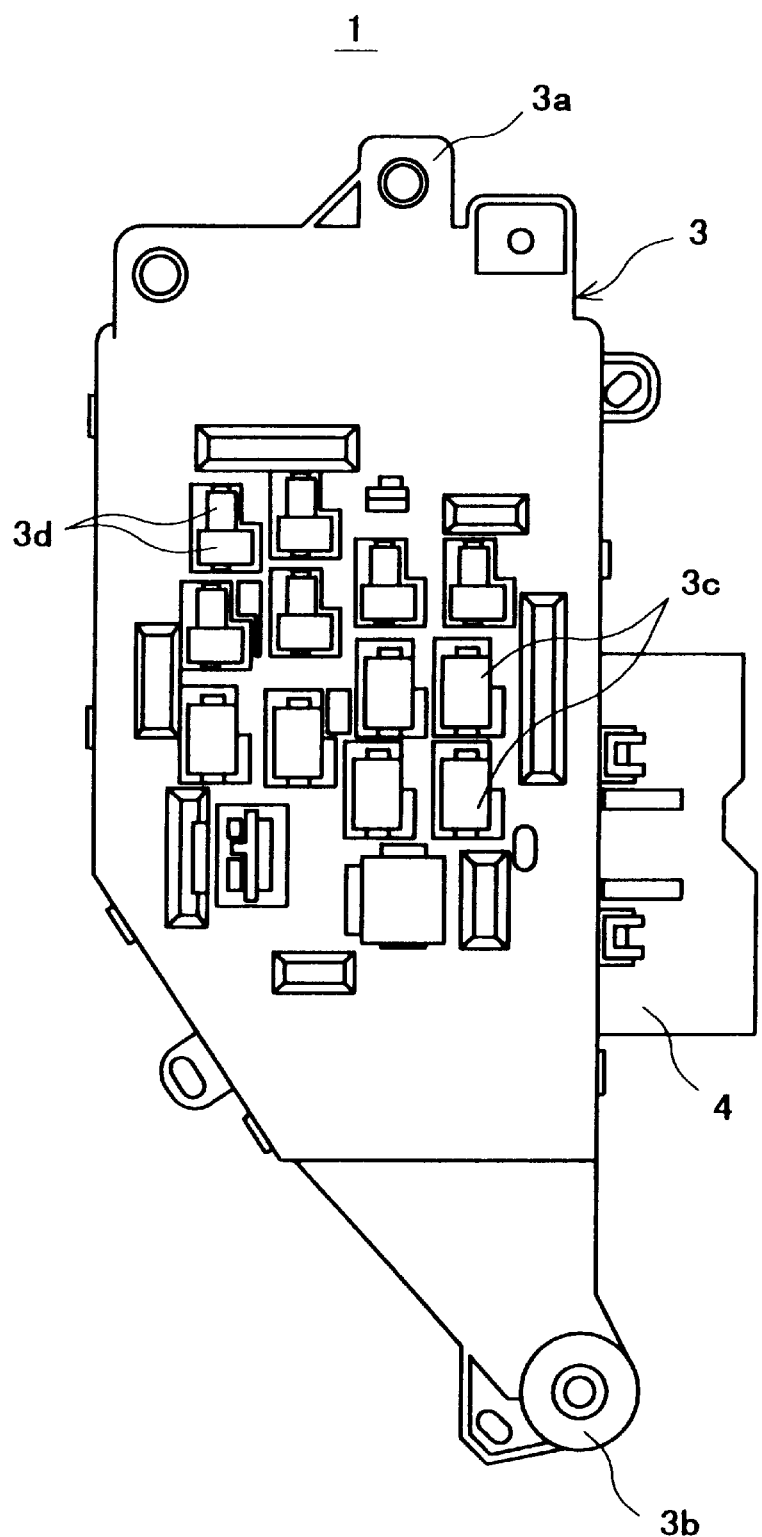
FIG. 1 is a side view of an embodiment of an electric connection box according to the present invention.
Figure 2:
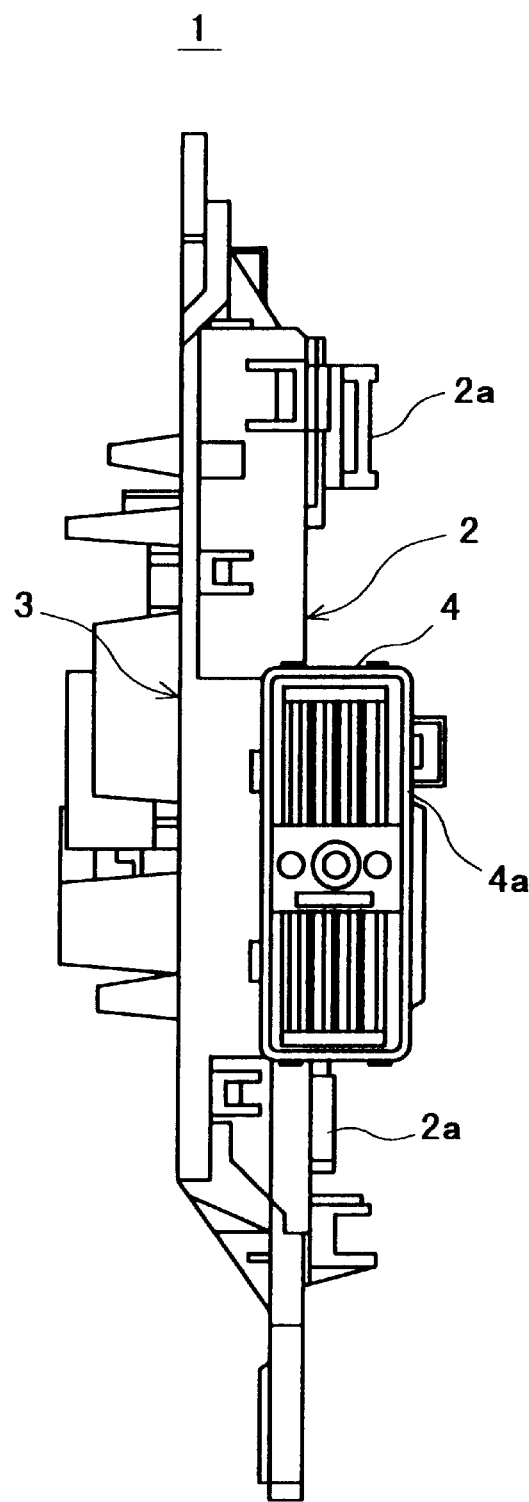
FIG. 2 is a plan view of an embodiment of an electric connection box according to the present invention.

An electric connection box 1 comprises, as shown in FIG. 1 and FIG. 2, as a basic configuration, an upper case 2 as a first case, a lower case 3 as a second case to be fit with the upper case 2, a connector housing 4 for connecting a multi-way connector from the outside, a bus-bar 5 as basic wiring (refer to FIG. 3 and FIG. 4), etc. The electric connection box 1 is, for example, when mounted in an engine compartment of an automobile, arranged so that an opening portion 4a of the connector housing 4 faces upward, that is, the surfaces of the upper case 2 and the lower case 3 face the horizontal direction.

The upper case 2 and the lower case 3 are fit into each other while sandwiching the bus-bar 5 between them. On the side surface of the upper case 2 are provided housings 2a of a variety of connecters and are provided electric parts such as relays and fuses (not illustrated) at predetermined positions. On the other hand, the lower case 3 has integrally formed brackets 3a and 3b having screw holes at the two edges in the longitudinal direction. Electric parts 3c such as relays and fuses and a variety of terminals 3d are provided at predetermined position on the side surface. After the upper case 2 and the lower case 3 are fit together in as shown in FIG. 1 and FIG. 2, the connector housing 4 for connecting with the multi-way connector is mounted on the mount portions 2e and 3e (refer to FIGS. 4 and 6) formed respectively at the upper case 2 and the lower case 3.

The connector housing 4 is formed, at the portion where the terminal portion 7, that is, the plurality of terminal pieces 7a, of the bus-bar 5 is arranged, as a tube with an approximately rectangular cross-section so as to surround the plurality of terminal pieces 7a. The multi-way connector (not illustrated) of an external cable is inserted from the opening 4a for connection.

Figure 3:
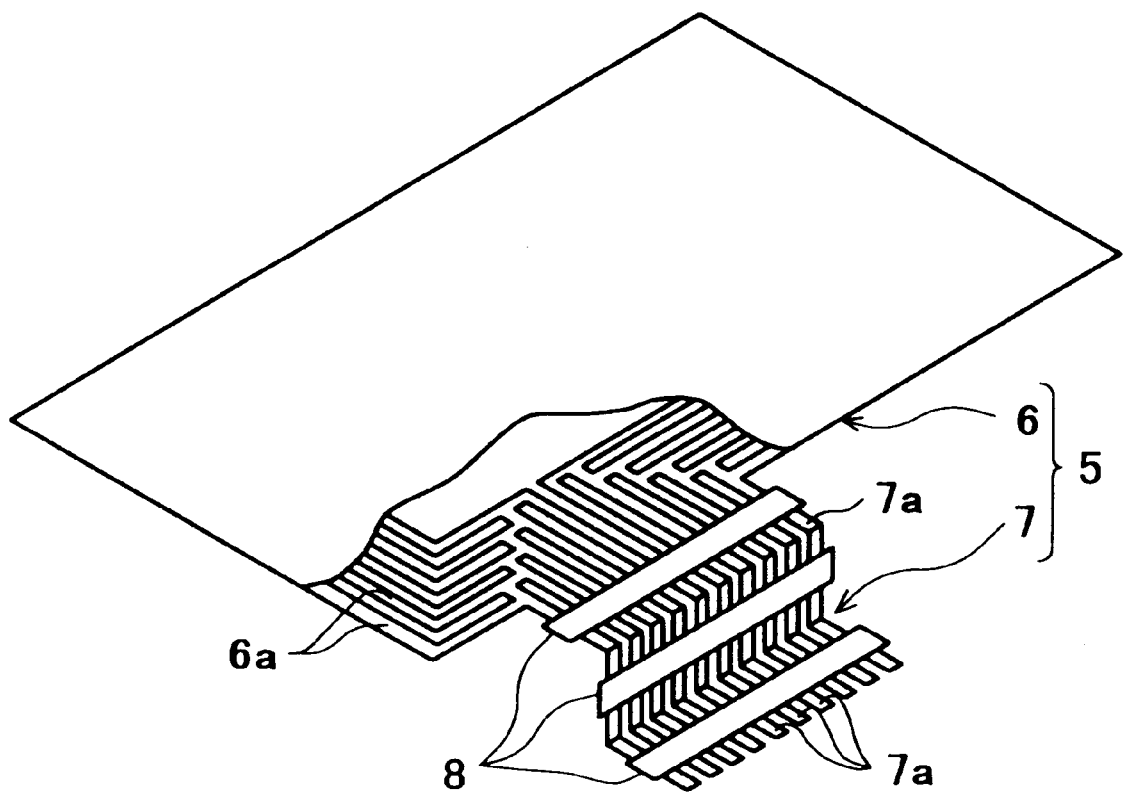
FIG. 3 is a perspective view of an embodiment of a bus-bar having narrow width terminal pieces placed in the electric connection box shown in FIGS. 1 and 2.

The bus-bar 5 is formed by punching it out from a conductive metal sheet of copper, a copper alloy, brass, etc. by a press and, as shown in FIG. 3, comprises a flat sheet-like bus-bar body 6 comprised of a plurality of wiring portions 6a and the terminal portion 7 projecting from the edge of the bus-bar body 6.

The terminal portion 7 has a plurality of terminal pieces 7a extending in parallel from the bus-bar body 6. The plurality of terminal pieces 7a are connected to the wiring portions 6a. Also, the plurality of terminal pieces 7a are formed to a width of about ½ to ¾ that of conventional terminal pieces, that is, a width between 1.0 mm and 1.3 mm, and a projecting length of 55 mm to 73 mm. Three long insulators 8 are provided at predetermined intervals so as to cut across the parallel plurality of terminal pieces 7a and connect and secure the plurality of terminal pieces 7a with each other. As the material for the insulators 8, nylon (including polymer alloys), polypropylene, polybutylene terephthalate, etc. can be used.

Further, the plurality of terminal pieces 7a have step portions forming identical crank shapes formed by bending by about 90 degrees in opposite directions at the two regions sandwiched by the insulators 8. By being formed in this way, the step portions can absorb any impact etc. at the time of connecting or disconnecting a connector, therefore deformation or damage etc. of the terminal pieces 7a can be prevented. Further, the plurality of terminal pieces 7a can be used stretched out straight as they are instead of being bent in a crank shape as above.

Figure 4:
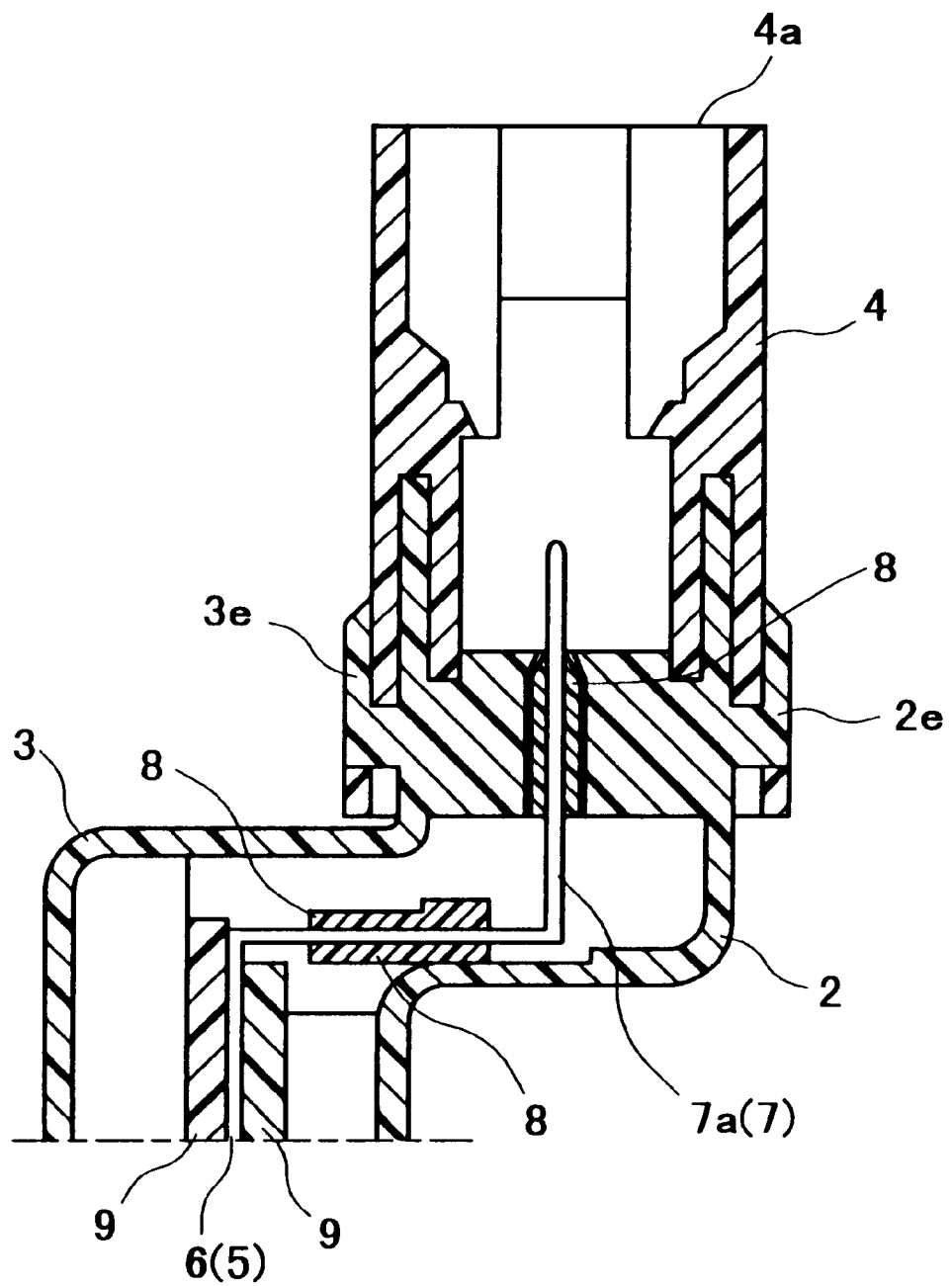
FIG. 4 is a sectional view of a connector housing in which a plurality of terminal pieces are arranged and its periphery in an embodiment of the electric connection box of the present invention.

When the above bus-bar 5 is attached in the state sandwiched by the upper case 2 and the lower case 3, the plurality of terminal pieces 7a are secured to each other by the insulators 8 in the region of the connector housing 4 as shown in FIG. 4.

Figure 5:
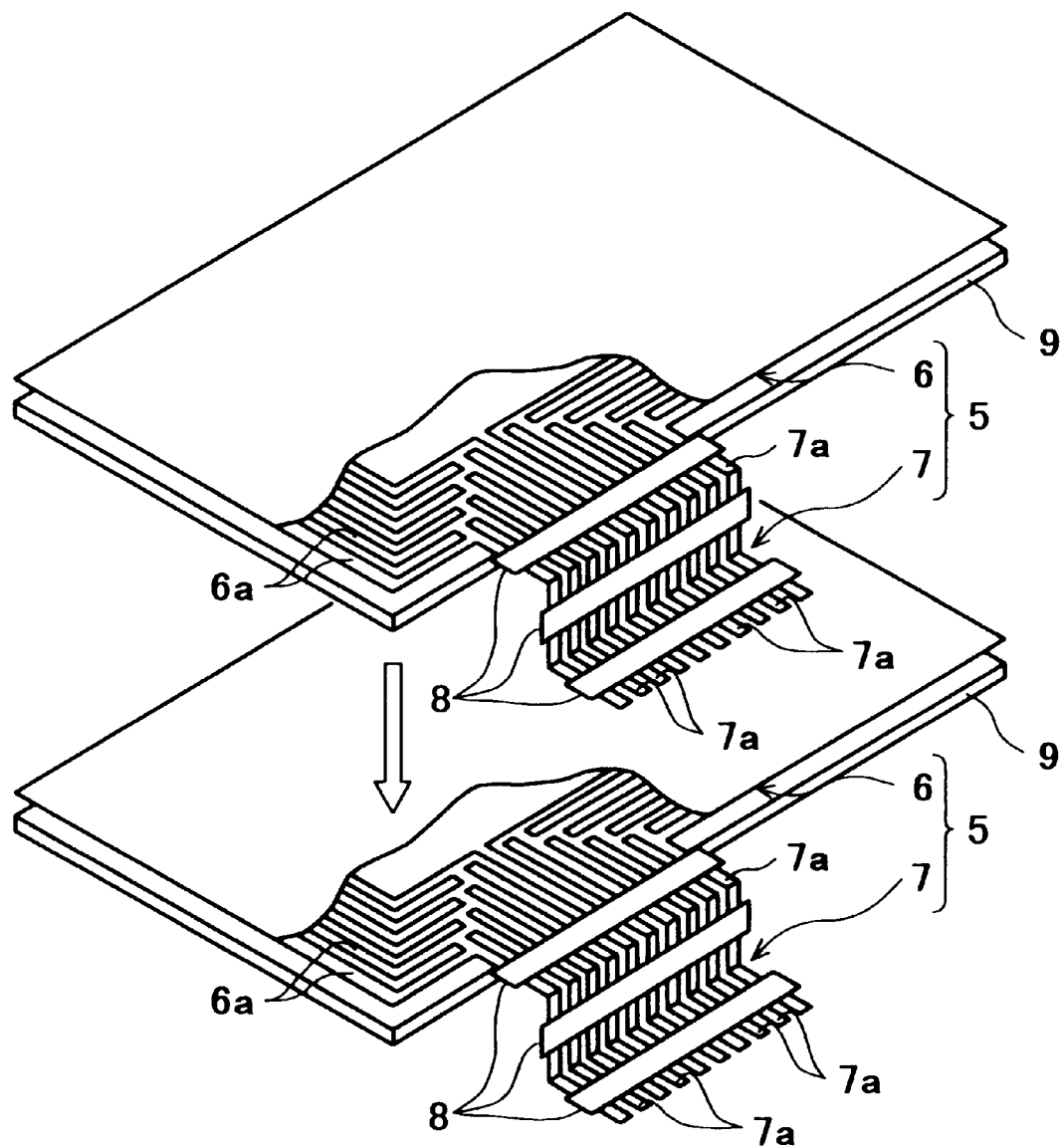
FIG. 5 is a perspective view of the bus-bars shown in FIG. 3 in a stacked state.

On the other hand, when using a plurality of the above bus-bars 5, the plurality of bus-bars 5 are stacked, as shown in FIG. 5, while sandwiching insulating sheets 9 composed of nylon (including polymer alloys), polypropylene, polybutylene terephthalate, etc. between the bus-bar 5 bodies 9. Namely, when stacking the plurality of bus-bars 5 via the insulating sheets 9, the terminal pieces 7a of the bus-bar 5 are superposed over the corresponding terminal pieces 7a of the other bus-bars 5 and the bent portions or the areas near the bent portions match in position with the insulators 8 provided at the corresponding terminal pieces 7a of the other bus-bars 5. By stacking in this way, the bus-bars 5 can be positioned with respect to each other and the terminal portions 7 are secured to each other via the insulators 8.

Also, when the upper case 2 and the lower case 3 are fit together facing each other in this state from the two sides and the connector housing 4 is attached to the mount portions 2e and 3e, the plurality of stacked bus-bars 5 become firmly secured inside the two cases 2 and 3.

Figure 6:
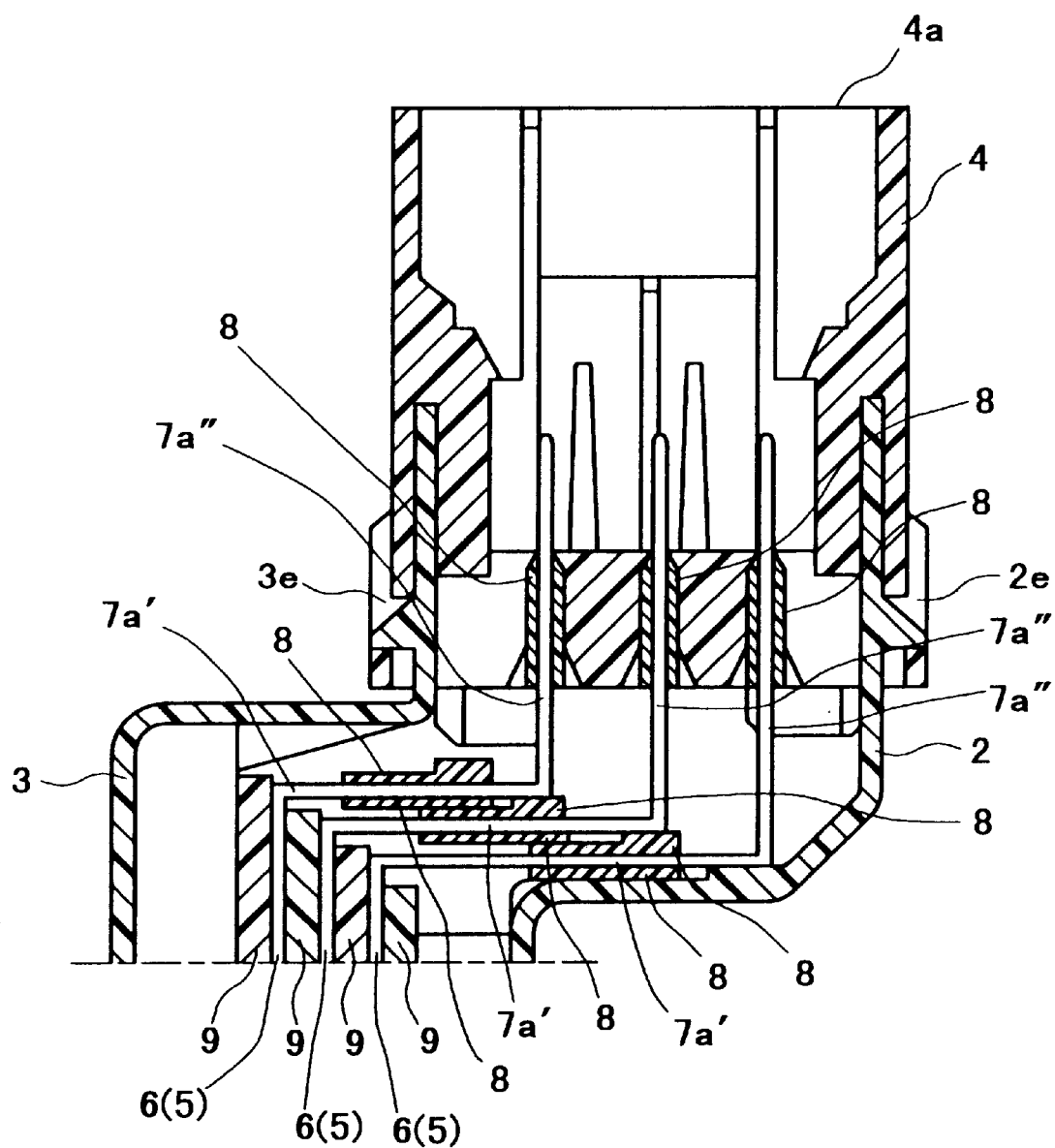
FIG. 6 is a sectional view of a connector housing in which a plurality of terminal pieces are arranged and its periphery in another embodiment of an electric connection box of the present invention.

Accordingly, in the electric connection box 1 according to the present embodiment, at the plurality of terminal portions 7, the portions 7a' stretching straight from the first bent portions are mutually supported by the insulators 8 provided at the other adjoining portions 7a' as shown in FIG. 6. Also, portions 7a" arranged in the connector housing 4 are supported by the inner walls of the connector housing 4 via the insulators 8.

As a result, even when connecting a multi-way connector (not illustrated) to the connector housing 4, deformation of the terminal pieces 7a can be prevented. Also, since the plurality of terminal pieces 7a forming one terminal portion 7 are connected in the width direction at a plurality of intermediate locations by the insulators 8 provided in parallel to the bent portions, it is possible to prevent the arrangement of the terminal pieces 7a from being disturbed by the connection of a multi-way connector.

Further, in the electric connection box 1, since the insulators 8 are provided at the terminal piece 7a side, it is not necessary to change the structure of the upper case 2 or the lower case 3 and the structure does not become complex. Also, it is not necessary to provide separate supporting members between the terminal pieces as in the related art and the number of components does not increase, so that the manufacturing costs can be reduced and the cost of part control can be kept down.

Note that in the above embodiment, a case of an electric connection box using a bus-bar having narrow width terminal pieces was explained, however, needless to say the present invention can also be applied to an electric connection box using a bus-bar having terminal pieces of an ordinary width.

Also, the plurality of terminal pieces stretching from the bus-bar body are not limited to ones bent in the above crank shape so long as they project out in a state arranged in parallel and are provided at intermediate portions with insulators to connect them. It is also possible to use ones stretching out straight and also ones curved midway.

As explained above, according to the electric connection box of the present invention, even when using bus-bars having narrow width terminal pieces, the structure of the upper case and the lower case does not become complex, the terminal pieces having a narrow width can be supported without increasing the number of components, and disturbance of the pitch and deformation of the terminal pieces can be prevented.

INDUSTRIAL APPLICABILITY

As explained above, the electric connection box of the present invention can prevent a disturbance of the pitch or deformation of terminal pieces when connecting a multi-way connector from the outside without making the structure complex and without increasing the number of components, therefore is useful for one installed in an automobile etc. for use as an electric connection box for connecting a multi-way connector.

What is claimed is:

1. An electric connection box comprising:
   a first case;
   a second case fitting with said first case to form a bus-bar housing, said bus-bar housing having a main hollow portion and an end hollow attachment portion connected to the main hollow portion and positioned at an end of the main hollow portion,
   said end hollow attachment portion having:
     a first horizontal hollow projection projected from the end of the main hollow portion in a horizontal direction parallel to a plane of the main hollow portion,
     an intermediate hollow projection connected to and intersected to the first horizontal hollow projection at approximately right angle, and
     a second horizontal hollow projection connected to and intersected to the intermediate hollow projection and being parallel to the first horizontal hollow projection;
   a connector housing mounted on the second horizontal hollow projection of the end hollow attachment portion to receive a connector from the outside;
   an electric-conductive bus-bar comprising a main bus bar and a terminal portion integrated with the main bus bar, the main bus bar being accommodated in the main hollow portion of the bus-bar housing and the terminal portion being accommodated in the end hollow attachment portion of the bus-bar housing, said terminal portion having a plurality of terminal pieces arranged in parallel,
   each terminal piece including:
     a first terminal piece portion connected to the main bus bar and extending in the first horizontal hollow projection of the end hollow attachment portion,
     a second terminal piece portion connected to the first terminal piece, bent thereat and extending in the intermediate hollow projection of the end hollow attachment, and
     a third terminal piece portion connected to the second terminal piece, bent thereat and extending in the second horizontal hollow projection to the connector housing;
     a first insulator means for holding the first terminal piece portion at the both sides to a portion where the first terminal piece portion is bent;
     a second insulator means for holding the second terminal piece portion at the both sides adjacent a portion where the second terminal piece portion is bent, an outer side insulator of the second insulator being supported by an inner wall of the intermediate hollow projection; and
     a third insulator means arranged around a pin hole formed at an end of the second horizontal hollow projection,
   said third terminal piece portion being fixed to the third insulator means to pass through the third insulator means to thereby project a tip thereof in the connector housing.

2. An electric connection box comprising:
   a first case;
   a second case fitting with said first case to form a bus-bar housing, said bus-bar housing having a main hollow portion and an end hollow attachment portion connected to the main hollow portion and positioned at an end of the main hollow portion,
   said end hollow attachment portion having:
     a first horizontal hollow projection projected from the end of the main hollow portion in a horizontal direction parallel to a plane of the main hollow portion,
     an intermediate hollow projection connected to and intersected to the first horizontal hollow projection at approximately right angle, and a second horizontal hollow projection connected to and intersected to the intermediate hollow projection and being parallel to the first horizontal hollow projection;

a connector housing mounted on the second horizontal hollow projection of the end hollow attachment portion to receive a connector from the outside;

a plurality of insulator means;

an electric-conductive stacked bus bar stacked by a plurality of bus-bars with the plurality of insulator means, each bus-bar comprising a main bus bar and a terminal portion integrated with the main bus bar, the main bus bar being accommodated in the main hollow portion of the bus-bar housing and the terminal portion being accommodated in the end hollow attachment portion of the bus-bar housing, said terminal portion having a plurality of terminal pieces arranged in parallel, each terminal piece including:

a first terminal piece portion connected to the main bus bar and extending in the first horizontal hollow projection of the end hollow attachment portion, a second terminal piece portion connected to the first terminal piece, bent thereat and extending in the intermediate hollow projection of the end hollow attachment, and a third terminal piece portion connected to the second terminal piece, bent thereat and extending in the second horizontal hollow projection to the connector housing, said plurality of insulator means including:

a first insulator means for holding the first terminal piece portion at the both sides to a portion where the first terminal piece portion is bent, a second insulator means for holding the second terminal piece portion at the both sides adjacent a portion where the second terminal piece portion is bent, an outer side insulator of the second insulator being supported by an inner wall of the intermediate hollow projection, and a third insulator means arranged around a pin hole formed at an end of the second horizontal hollow projection, said third terminal piece portion being fixed to the third insulator means to pass through the third insulator means to thereby project a tip thereof in the connector housing, and said plurality of insulator means and said plurality bus-bars being integrately stacked and fixed in the end hollow attachment portion.

3. The electric connection box of claim 2, wherein the second insulator means of at least one of said plurality of bus-bars supporting the second terminal piece portion of another of said plurality of bus-bars at a portion where the second terminal piece portion is bent to join said third terminal piece portion of said another of said plurality of bus-bars.

* * * * *

UNITED STATES PATENT AND TRADEMARK OFFICE
CERTIFICATE OF CORRECTION

PATENT NO. : 6,179,628 B1
DATED : January 30, 2001
INVENTOR(S) : Shin Hasegawa et al.

It is certified that error appears in the above-identified patent and that said Letters Patent is hereby corrected as shown below:

Item [86], please change:
§ 371 Date: "Aug. 14, 1999" to -- Oct. 21, 1999 --.
§ 102(e) Date: "Aug. 14, 1999" to -- Oct. 21, 1999 --.

Signed and Sealed this

Eighteenth Day of September, 2001

Attest:

NICHOLAS P. GODICI
Attesting Officer *Acting Director of the United States Patent and Trademark Office*